US005455188A

United States Patent [19]
Yang

[11] Patent Number: 5,455,188
[45] Date of Patent: Oct. 3, 1995

[54] PROCESS FOR FABRICATING A LATERAL BIPOLAR JUNCTION TRANSISTOR

[75] Inventor: Sheng-Hsing Yang, Hsinchu, Taiwan, Prov. of China

[73] Assignee: United Microelectronics Corp., Hsinchu, Taiwan, Prov. of China

[21] Appl. No.: 381,133

[22] Filed: Jan. 31, 1995

[51] Int. Cl.⁶ ................................................. H01L 21/265
[52] U.S. Cl. ................................ 437/32; 437/27; 437/28; 437/30; 437/50; 437/69; 437/150; 437/153; 437/917; 437/924; 437/984; 148/DIG. 10; 148/DIG. 11; 257/565; 257/575
[58] Field of Search ................................. 437/27, 28, 30, 437/32, 50, 69, 150, 153, 917, 984, 924, 31; 148/DIG. 10, DIG. 11; 257/565, 575

[56] References Cited

U.S. PATENT DOCUMENTS

| | | | |
|---|---|---|---|
| 4,966,858 | 10/1990 | Masquelier et al. | 437/32 |
| 4,971,929 | 11/1990 | D'Anna et al. | 437/32 |
| 5,187,109 | 2/1993 | Cook et al. | 437/32 |
| 5,256,589 | 10/1993 | Hozumi | 437/32 |
| 5,387,553 | 2/1995 | Moksvold et al. | 437/32 |

Primary Examiner—Olik Chaudhuri
Assistant Examiner—Long Pham
Attorney, Agent, or Firm—Ladas & Parry

[57]  ABSTRACT

A process for fabricating lateral bipolar junction transistor semiconductor device. Base and emitter regions are precisely aligned. The resulting lateral width of the base region of the transistor device is able be precisely controlled. A heavily-doped implantation region is formed underneath the base region of the transistor structural configuration such that electron carriers in the transistor are prevented from escaping from beneath the base region of the transistor.

6 Claims, 8 Drawing Sheets

PROCESS FOR FABRICATING A LATERAL BIPOLAR JUNCTION TRANSISTOR

BACKGROUND OF THE INVENTION

1. Field of the Invention

The present invention relates in general to a process for fabricating lateral bipolar junction transistors (BJT). In particular, the present invention relates to a process for fabricating lateral BJT having improved current gain.

2. Technical Background

Figure 1:
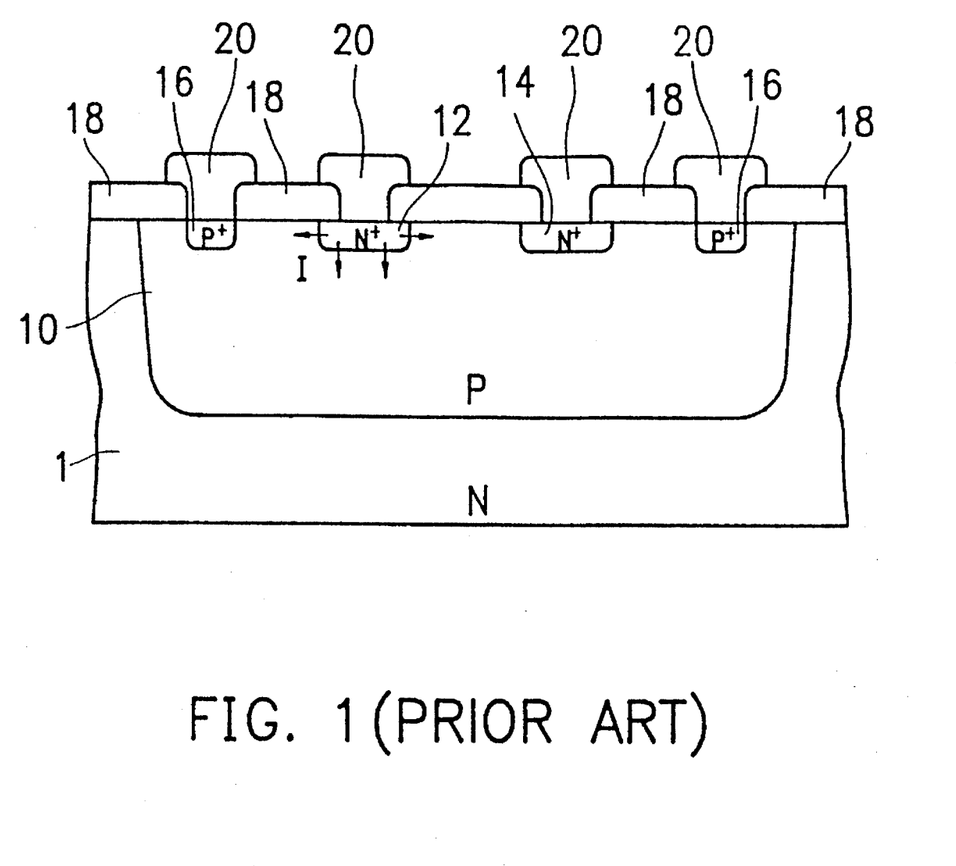
FIG. 1 schematically shows the cross section of a conventional lateral BJT.

Conventional lateral BJT's have limited current gain characteristics due to their inherent limitations in their semiconductor structural configurations. FIG. 1 of the accompanying drawing of the present invention shows schematically the cross section of a conventional lateral BJT, which is employed here for the purpose of description of the present invention.

As is seen in FIG. 1, a conventional BJT is fabricated out of an N-type substrate 1. P-well regions 10, although only one is shown in the drawing, are formed in N-type substrate 1 by methods known in the art. $N_+$-type emitter regions 12, as well as N+-type collectors 14 are formed in a P-well 10 subsequently for the bipolar junction transistor. P-well contact regions 16, that is, the contact regions for the base regions are then fabricated thereon. Insulation layer 18 is formed on substrate 1 and metal contacts 20 are then formed.

Since, as is observed in the drawing, emitter region 12 is not sufficiently isolated from the contact region 16 of base region 10, electron flow I, that is, the flow of negative carriers as emitted by emitter region 12, has a great portion thereof being absorbed by contact region 16 of base region 10. The result is the reception of the electron flow I insufficiently large, causing the conventional lateral BJT device to feature a current gain characteristics smaller than expected.

SUMMARY OF THE INVENTION

It is therefore an object of the present invention to provide process for fabricating a semiconductor structural configuration of a lateral BJT, having improved current gain characteristics.

A process is provided for fabricating lateral bipolar junction transistor semiconductor device resulting in a transistor structural architecture having precisely aligned base and emitter regions. The lateral width of the base region of the transistor device is able be precisely controlled. A heavily-doped implantation region is formed underneath the base region of the transistor structural configuration such that electron carriers in the transistor are prevented from escaping from beneath the base region of the transistor. The collection in the collector region of the electron carriers emitted by the emitter of the transistor device is thereby helped, resulting in an improvement of the current gain characteristics of the lateral BJT device.

In accordance with the process of the present invention, a P-well is formed on an N-type conductivity semiconductor substrate as the collector region for the transistor device. A first field oxide is formed on the substrate surrounded by the well region and second field oxide is formed on the outer edge of the well. An N-type lightly-doped region is formed in the substrate beneath the first field oxide as the base region for the transistor. The first field oxide is removed to form a recessed groove in the region being occupied by the first field oxide. An alignment is formed at the edge of the recessed groove. Sidewall spacers are formed for the alignment. The alignment and the sidewall spacers are used as masking for implanting N-type impurities into the lightly-doped region, the impurities being thermally driven into the depth of the substrate to form a N-type heavily-doped region in the deeper portion of the lightly-doped region. The second field oxide is used as masking for implanting N-type impurities into the substrate to form contact areas for the substrate. The alignment and the sidewall spacers are used as masking for implanting P-type impurities into the lightly-doped region to form the emitter region for the transistor. The second field oxide, the alignment and the sidewall spacers are then used as masking for implanting P-type impurities into the well regions to form contact areas for the well region.

Other objects, features and advantages of the present invention will become apparent by way of the following detailed description of the preferred but non-limiting embodiment.

BRIEF DESCRIPTION OF THE DRAWING

The detailed description below is made with reference to the accompanying drawings, wherein.

DETAILED DESCRIPTION OF THE PREFERRED EMBODIMENT

To describe the structural configuration and its process of fabrication of the semiconductor lateral BJT semiconductor device of the present invention, reference is made to FIGS. 2a to 2m, which schematically depict the appropriate cross sections of the lateral BJT in accordance with a preferred embodiment of the present invention, as taken from selected stages in the process of fabrication.

Figure 3:
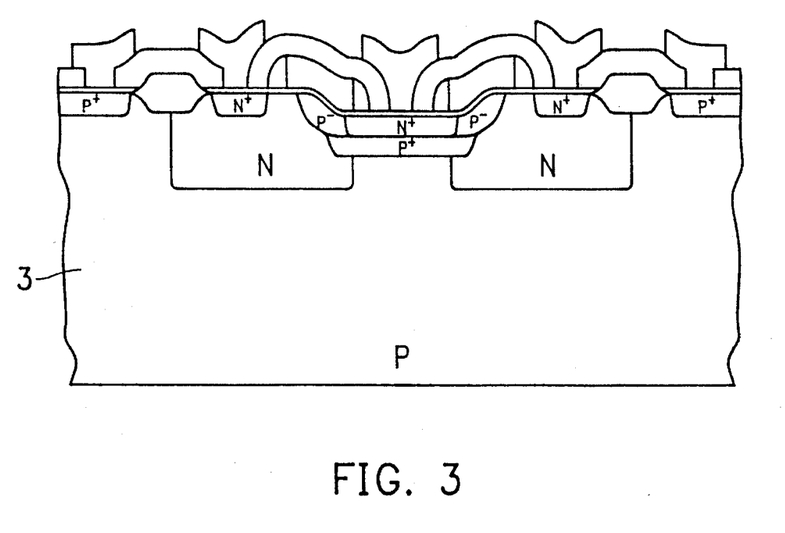
FIG. 3 schematically show the cross section of a symmetrical lateral BJT fabricated in accordance with another preferred embodiment of the present invention.

The structural configuration, as well as the process of fabrication, of the lateral BJT semiconductor device of the present invention is equally applicable to either an N-or P-type semiconductor substrate. The description of the fabrication process and the resulting device is based on an N-type substrate is selected. Persons skill in the art can appreciate the structural configuration and its related process of fabrication for a lateral BJT based on a P-type substrate 3, as shown in FIG. 3.

As indicated above, the structural configuration and the process of fabrication of the lateral BJT of a preferred embodiment of the present invention is described in the following selected process stages.

Stage 1

Figure 2A:
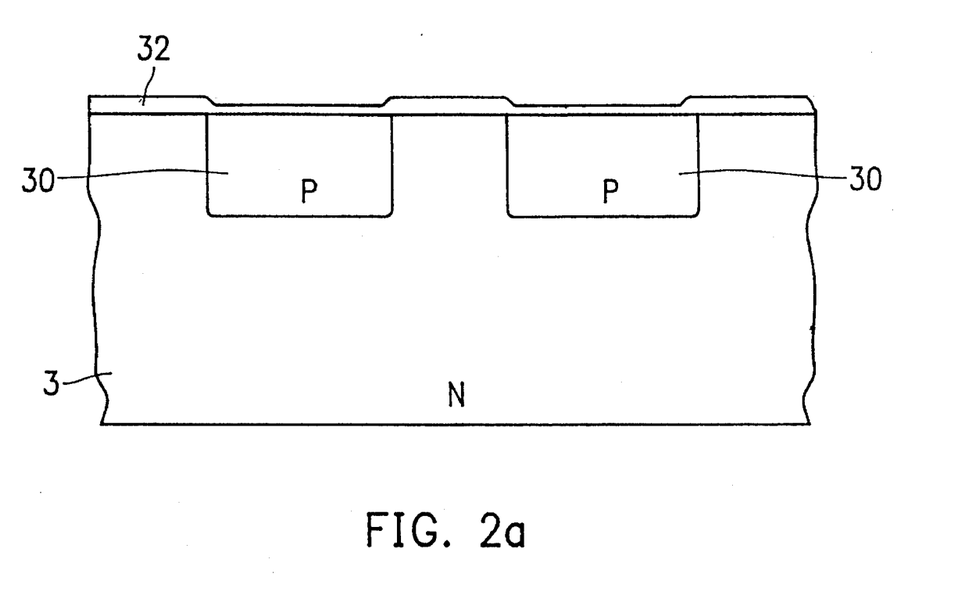
FIGS. 2a to 2m schematically show the cross sections of a symmetrical lateral BJT fabricated in accordance with a preferred embodiment of the present invention, as depicted in selected process stages of fabrication.

Referring to FIG. 2a, N-type substrate 3 is prepared and formed with P-well region 30 therein. The P-well can be formed by, for example, applying oxide layer 32 on the surface of substrate 3, and then forming a photoresist layer with selected openings for the implementation of an ion implantation process of ions such as, boron ions, followed by a procedure of thermal drive in. The result is the P-well such as that shown in FIG. 2a. After the P-well is formed, the oxide layer 32 can be removed.

Stage 2

In the second stage of the fabrication process, which is illustrated using FIGS. 2b–2e, first field oxide 40 will be formed and be surrounded by the P-well. In addition to first field oxide 40, second field-region oxide 42 will be also formed at the outer edge of the P-well. Beneath first field-region oxide 40, layer of N-type lightly-doped region 38 will be formed into substrate 3 as the base region for the subject lateral BJT device. These configurations are fabricated as described below.

Figure 2B:
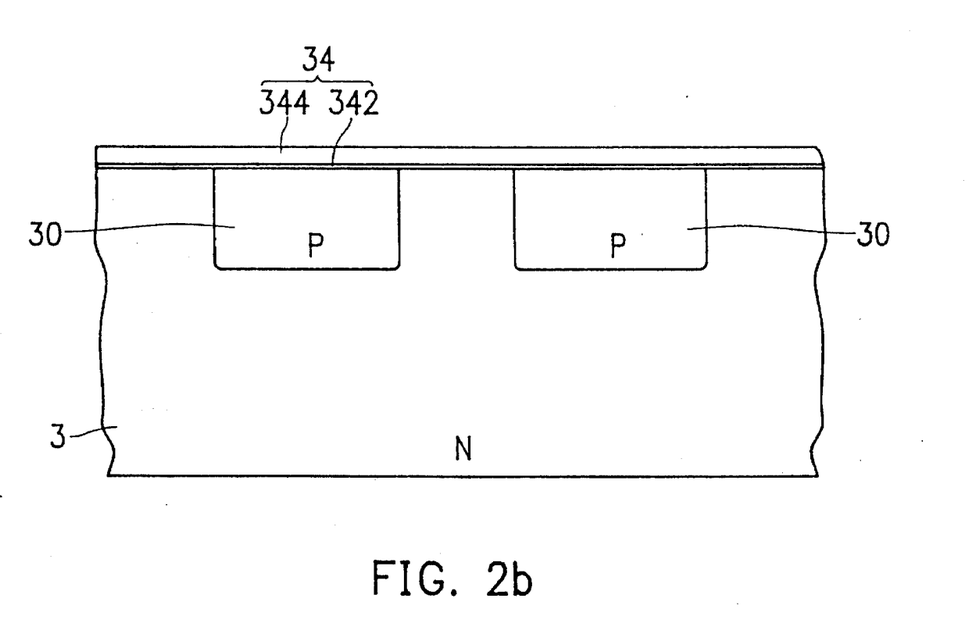

Reference is first made to FIG. 2b. As continued from the structure of FIG. 2a, masking layer 34 is formed by first growing a layer of pad oxide 342, with a thickness of about 300–500A, and then depositing a layer of nitride 344, with a thickness of about 1,000–2,000A. Masking layer 34 therefore comprises pad oxide layer 342 and nitride layer 344.

Figure 2C:
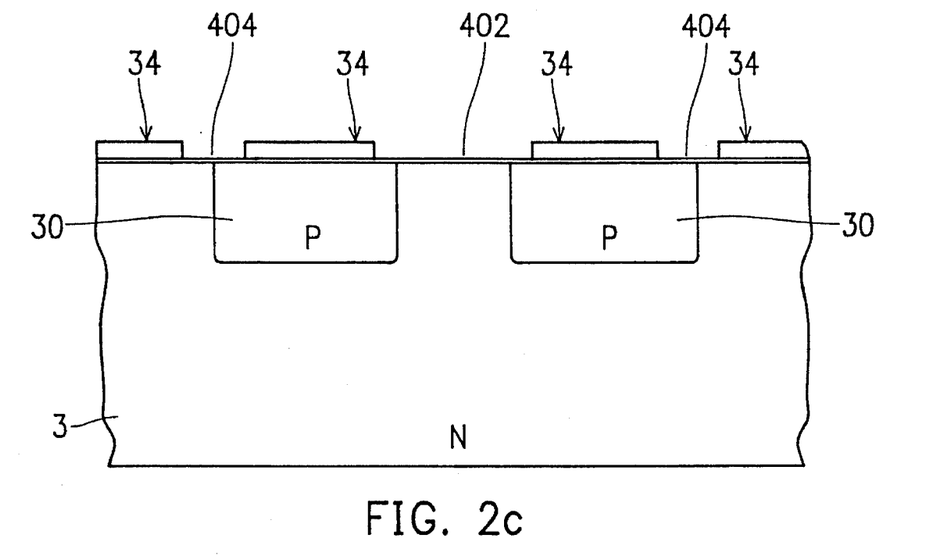

Referring next to FIG. 2c, masking layer 34 is prepared with openings in the region surrounded by P-well 30, as well as on the outer edge of P-well 30. These openings, 402 and 404 in masking layer 34, are made by, for example, etching, such as PIE (reactive ion etching).

Figure 2D:
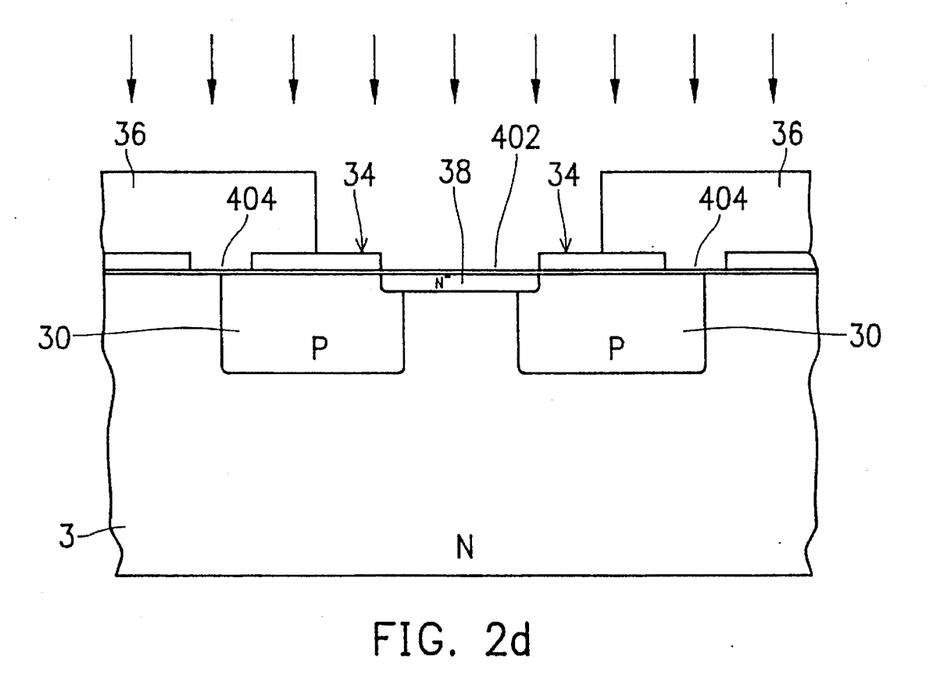

Then, as shown in FIG. 2d, layer of photoresist 36 is formed on the structure of substrate 3, covering all portions except opening 402 and the portion of the masking layer 34 as shown in FIG. 2d. N-type impurities, such as phosphorus, are doped in a doping procedure to form N-type lightly-doped region 38 in substrate 3.

Figure 2E:
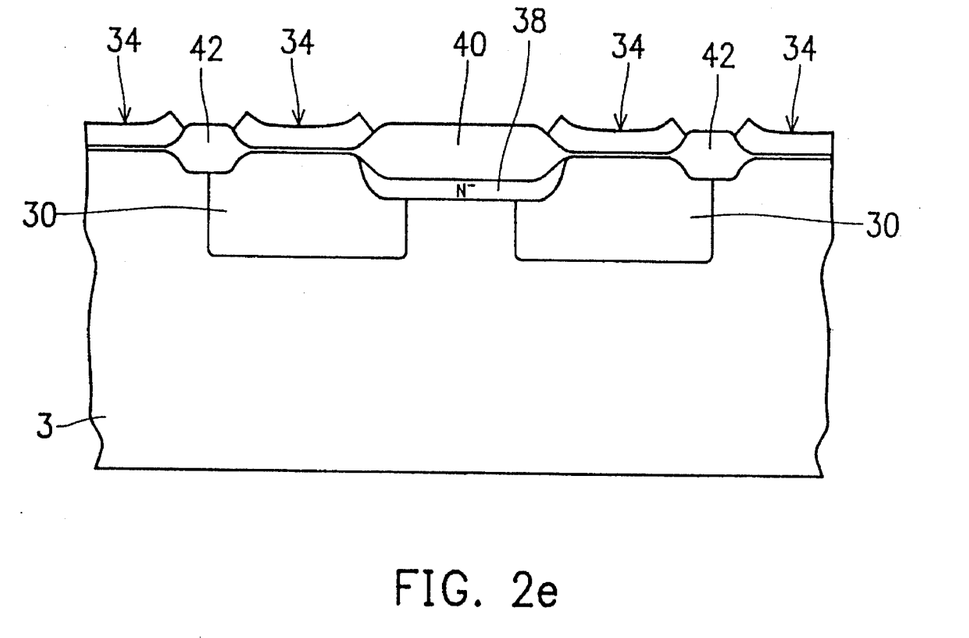

Refer next to FIG. 2e. After the implementation of a thermal oxidation, first and second field oxides 40 and 42 are then formed in the regions of openings 402 and 404 as shown in the previous FIGS. 2c and 2d, with a thickness of about 5,000–12,000A. At this stage, masking layer 34 is etched away.

Notice should be taken that in the accompanying drawings of the present invention, dimensions such as the depth, or width, of the structural layers are not drawn to exact scale. The dimensions in the drawings are drawn to the relative scale for the understanding of the description of the present invention.

Stage 3

Figure 2F:
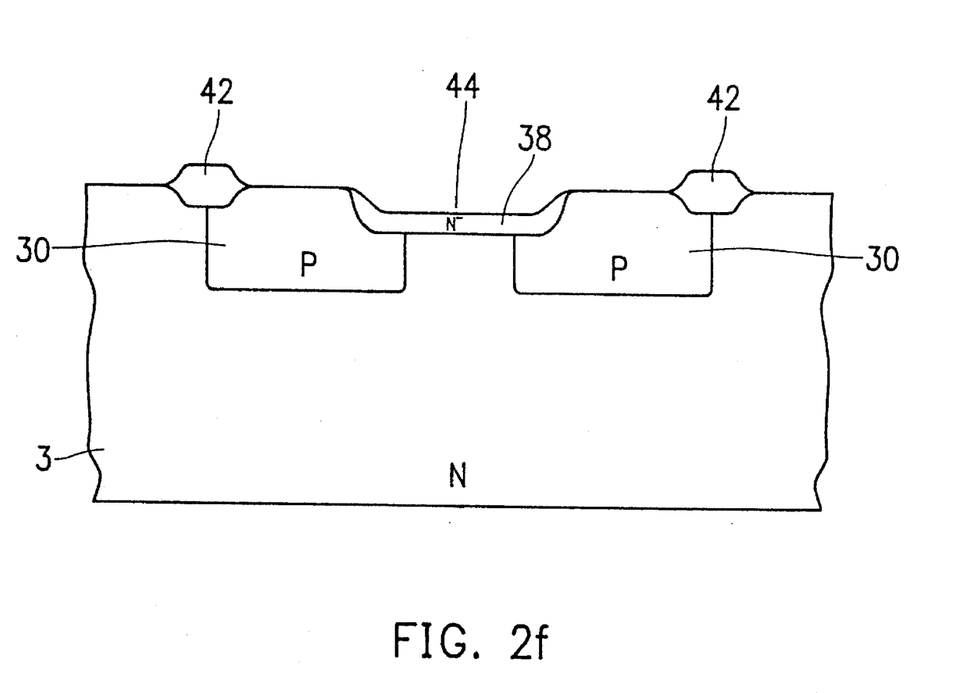

Referring next to FIG. 2f., first field oxide 40 is removed, leaving recessed groove 44 such as shown in the drawing.

Stage 4

Figure 2G:
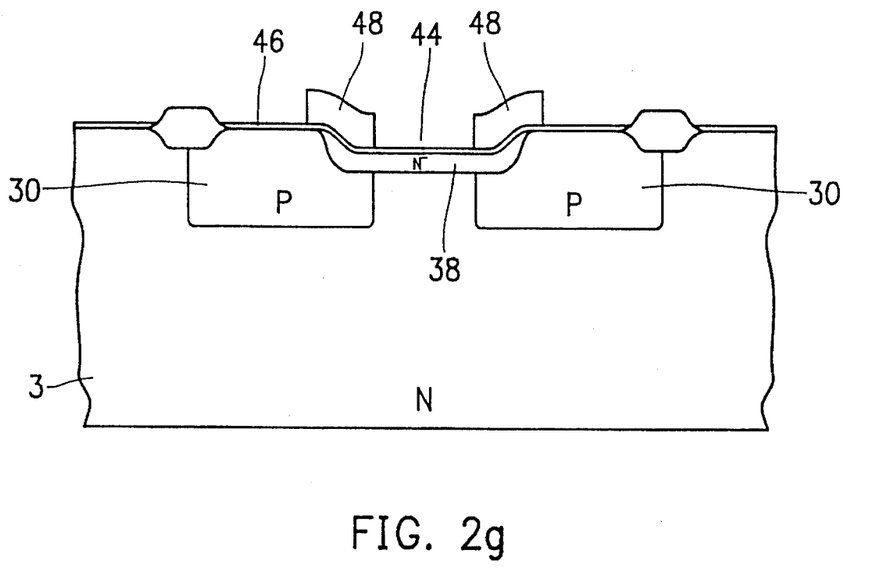

Referring now to FIG. 2g, alignment 48 is then formed along the side of recessed groove 44. This can be done in the typical CMOS fabrication process by first implementing a thermal oxidation to form gate oxide layer 46 with a thickness of about 100–1,000 Å. A further layer of polysilicon with a thickness of about 2,000–5,000 Å is then deposited thereon. The polysilicon layer is then subjected to an etching procedure to leave alignment 48 such as is shown in the drawing.

Stage 5

Figure 2H:
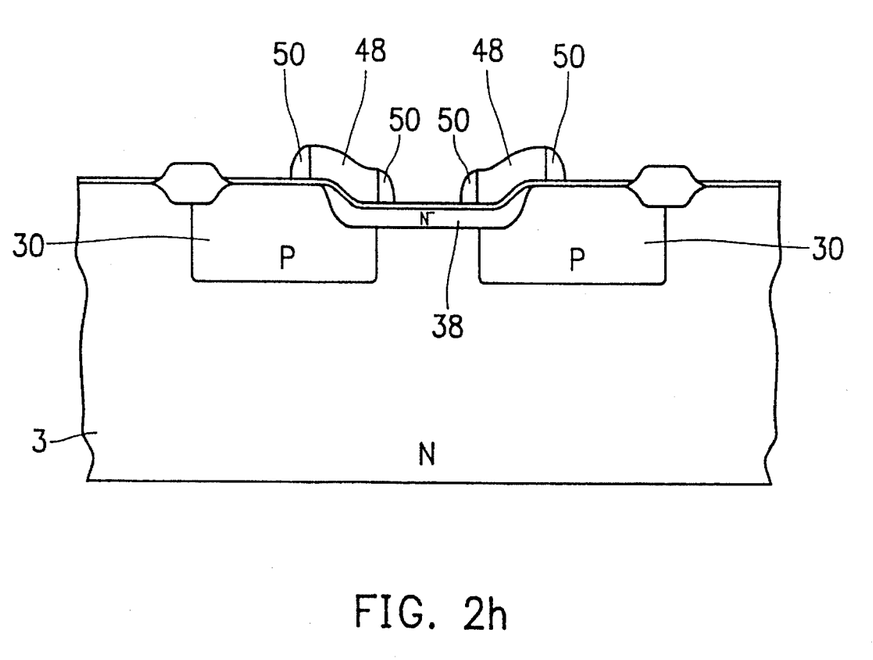

Refer next to FIG. 2h. Sidewall spacers 50 are then formed on the sidewalls of alignment 48. This can be achieved by depositing a layer of oxide or nitride with a thickness of about 2,000–7,000 Å and then conducting an etch back process by plasma etching, leaving sidewall spacers 50 composed of oxide or nitride as shown in the drawing.

Stage 6

Figure 2I:
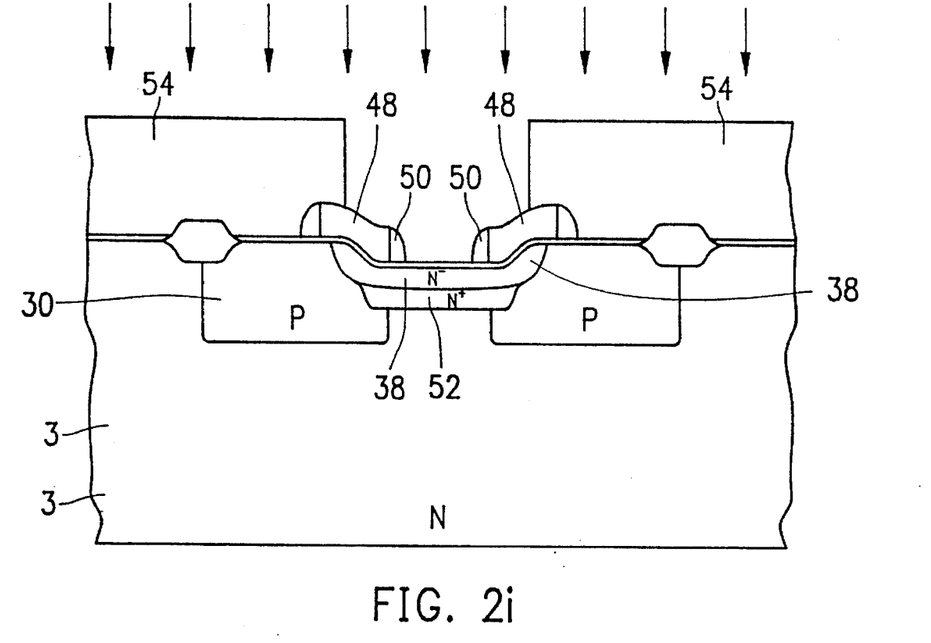

Referring next to FIG. 2i, alignment 48 and its attached sidewall spacers 50 are then utilized as the mask for an ion implantation process, in which N-type impurities are implanted into N-type lightly-doped region 38, and then subjected to a thermal drive-in procedure to form N-type heavily-doped region 52 at the inner portion of the region 38 as shown in the drawing. For example, photoresist layer 54 can be applied to cover all other areas of substrate 3 except the region to be subjected to the ion implantation procedure. Impurities such as phosphorus or arsenic with a concentration of about $5 \times 10^{17} - 3 \times 5^{E17-3E18}$ atoms / $cm^3$ can be selected to be implanted. A thermal drive-in process follows to form N-type heavily-doped region 52. Afterwards, photoresist layer 54 is removed.

Stage 7

Figure 2J:
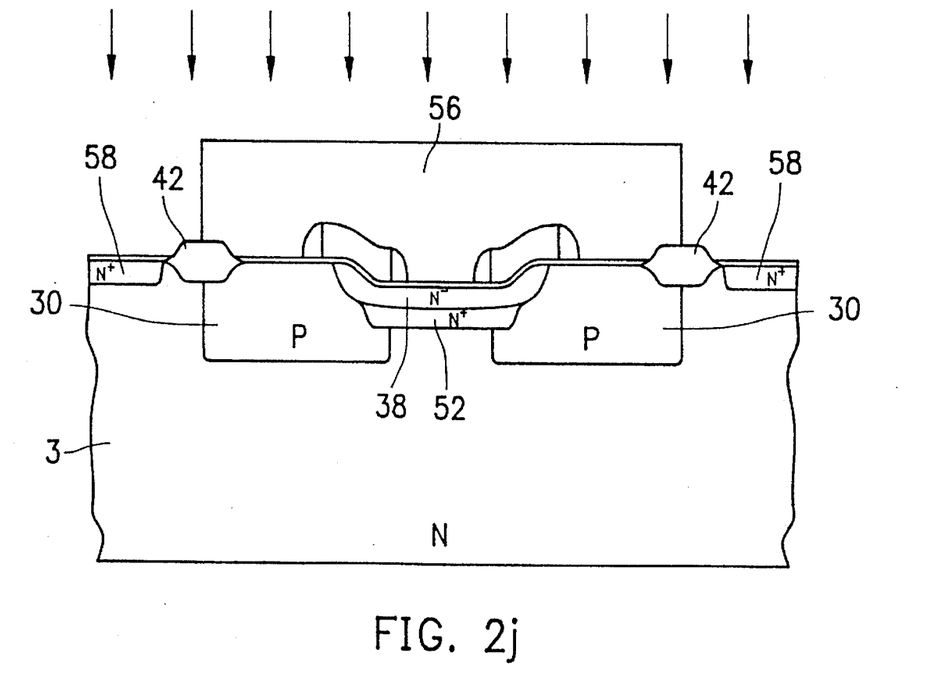

Referring now to FIG. 2j, second field oxide 42 is then utilized as the mask for the implantation process of implanting N-type impurities into substrate 3, thereby forming contact areas 58 for semiconductor substrate 3. This can be done by, for example, preparing a layer of photoresist 56 covering all the area except where the contact areas for semiconductor substrate 3 are to be formed. With the presence of photoresist layer 56, the ion implantation procedure can be conducted to form $N_+$-type contact area 58, and the photoresist layer can then be removed.

Stage 8

Figure 2K:
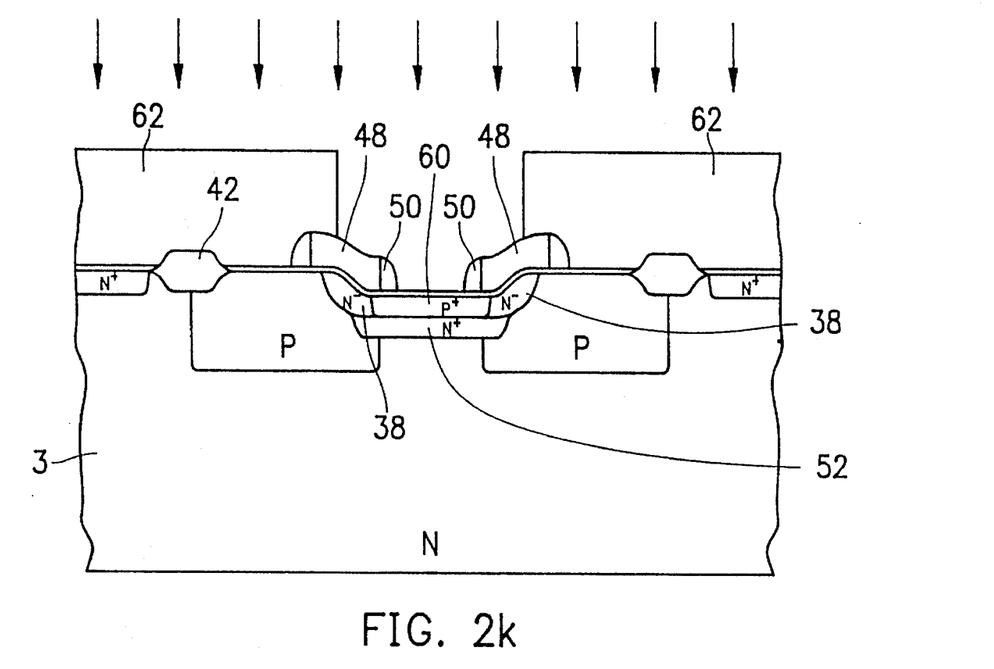

Refer next to FIG. 2k. Alignment 48 and its attached sidewall spacers 50 are again utilized as the mask for the implementation of another ion implantation process. At this instance, P-type impurities are implanted into N-type lightly-doped region 38 to form emitter region 60 for the subject lateral BJT device.

For example, this can be done by employing photoresist layer 62 that covers all areas other than the emitter region for the lateral BJT. P-type impurities such as boron can then be implanted into region 38 to form the emitter region 60. After this, photoresist layer 62 can be removed.

At this moment, it should be pointed out that Stage 8 can be processed before Stage 7 described above. If this is the case, photoresist layer 54 employed in the photoresisting procedure in Stage 6 can be utilized to reduce the steps involved in the fabrication procedure.

Stage 9

Figure 2L:
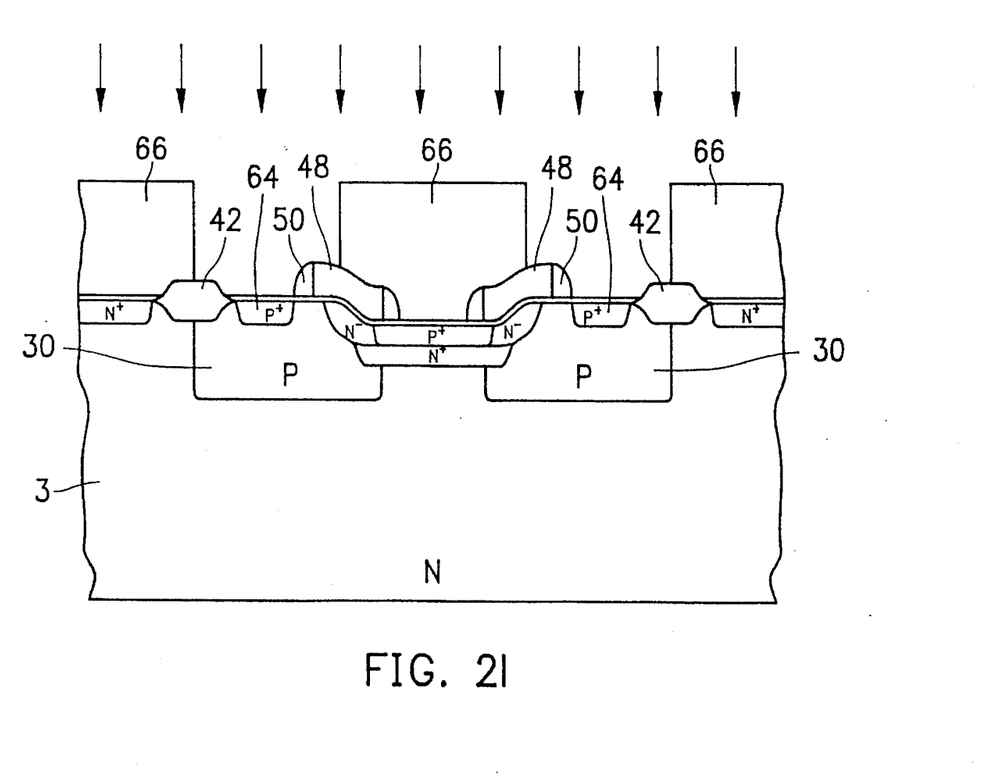

Referring next to FIG. 2l, second field oxide layer 42 and alignment 48 as well as its attached sidewall spacers 50 are utilized as the mask for the implementation of an ion implantation procedure. P-type impurities are implanted into P-well 30 to form $P_+$ contact areas 64 for P-well 30.

For example, this can be done by employing photoresist layer 66 that covers all areas other than the contact area for the P-well. P-type impurities can then be implanted into the exposed areas to form $P_+$ contact areas 64. After this, photoresist layer 66 is removed.

It should be pointed out that this Stage 9 can be implemented together with Stage 8 above to reduce the complexity of the fabrication procedure.

Stage 10

Figure 2M:
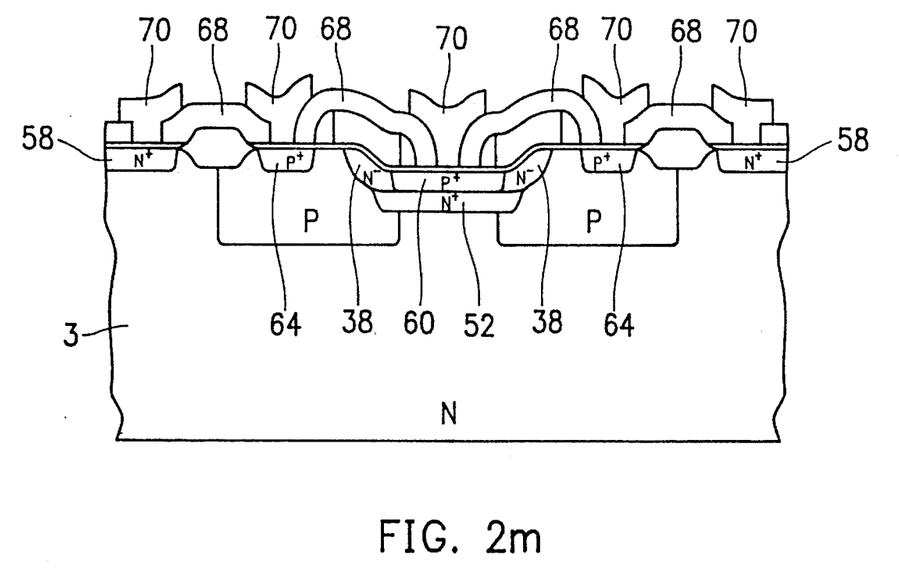

Referring now to FIG. 2m, a procedure of metalization is conducted by, for example, first depositing BPSG insulation layer 68 and then etching to form metal vias. A sputtering process is then performed to form a metal that is subjected to further etching so that metal contacks 70 are formed as shown in the drawing.

This above described process stages for the fabrication of the lateral BJT semiconductor device in accordance with the present invention result in a transistor structural architecture having precisely aligned base and emitter regions. The alignment precision of the base and emitter regions is a result of the automatic self-alignment achieved inherently in the fabrication procedure of the present invention. The lateral width of the base region of the transistor device can therefore be precisely controlled.

In addition, due to the existence of the heavily-doped implantation region underneath the base region of the transistor structural configuration, electron carriers in the transistor are prevented from escaping from beneath the base region of the transistor. This helps to assist the collection in the collector region of the electron carriers emitted by the emitter of the transistor device. A direct result is the immediate improvement of the current gain characteristics of the lateral BJT device of the present invention.

The above-described preferred embodiment of the present invention is utilized only for the purpose of the description of the present invention. Persons skilled in this art can appreciate the fact that other similar arrangements can be devised from the embodiments disclosed above without departing from the spirit of the present invention, which is recited in the claims that follow.

I claim:

1. A process for fabricating a lateral bipolar junction transistor semiconductor device comprising the steps of:
   (1) on a predetermined position of a semiconductor substrate having a first conductivity type, forming a well region of a second conductivity type as a collector region of said transistor device;
   (2) forming a lightly-doped region of the first type in said substrate surrounded by said well region as a base region for said transistor;
   (3) forming on said substrate:
      (i) a first field oxide surrounded by said well region, and
      (ii) a second field oxide at an outer edge of said well region;
   (4) removing said first field oxide to form a recessed groove in a region being occupied by said first field oxide;
   (5) forming an alignment at an edge of said recessed groove;
   (6) forming sidewall spacers for said alignment;
   (7) utilizing said alignment and said sidewall spacers as masking for implanting impurities of the first conductivity type into said lightly-doped region, said impurities being thermally driven into a depth of said substrate to form a heavily-doped region of the first conductivity type in a deeper portion of said lightly-doped region;
   (8) utilizing said second field oxide as masking for implanting impurities of the first conductivity type into said substrate to form at least one contact area for said substrate;
   (9) utilizing said alignment and said sidewall spacers as masking for implanting impurities of the second conductivity type into said lightly-doped region to form an emitter region for said transistor; and
   (10) utilizing said second field oxide, said alignment and said sidewall spacers as masking for implanting impurities of the second conductivity type into said well region to form at least one contact area for said well region.

2. The process for fabricating a lateral bipolar junction transistor semiconductor device of claim 1, further comprising the step of metalization.

3. The process for fabricating a lateral bipolar junction transistor semiconductor device of claim 2, wherein said step of forming said first and second field oxides on said substrate includes the steps of:

forming a mask layer on said substrate;
   forming a first and a second opening respectively in the areas for said first and said second field oxides;
   utilizing said mask layer as shielding for implementing a thermal oxidation to form respectively said first field oxide and said second field oxide in said first and second openings in said mask layer.

4. The process for fabricating a lateral bipolar junction transistor semiconductor device of claim 3, wherein said mask layer comprises oxide and nitride.

5. The process for fabricating a lateral bipolar junction transistor semiconductor device of claim 1 wherein said first conductivity type is N-type conductivity and said second conductivity type is P-type conductivity.

6. The process for fabricating a lateral bipolar junction transistor semiconductor device of claim 1 wherein said first conductivity type is P-type conductivity and said second conductivity type is N-type conductivity.

* * * * *